United States Patent
Guo et al.

(10) Patent No.: US 9,640,390 B1
(45) Date of Patent: May 2, 2017

(54) METHOD FOR MODIFYING AND CONTROLLING THE THRESHOLD VOLTAGE OF THIN FILM TRANSISTORS

(71) Applicant: Thin Film Electronics ASA, Oslo (NO)

(72) Inventors: Wenzhuo Guo, Cupertino, CA (US); Fabio Zurcher, Brisbane, CA (US); Arvind Kamath, Mountain View, CA (US); Joerg Rockenberger, San Jose, CA (US)

(73) Assignee: Thin Film Electronics ASA, Oslo (NO)

( * ) Notice: Subject to any disclaimer, the term of this patent is extended or adjusted under 35 U.S.C. 154(b) by 174 days.

(21) Appl. No.: 13/889,243

(22) Filed: May 7, 2013

Related U.S. Application Data

(62) Division of application No. 12/357,065, filed on Jan. 21, 2009, now Pat. No. 8,460,983.

(Continued)

(51) Int. Cl.
*H01L 21/02* (2006.01)
*C08G 77/56* (2006.01)
(Continued)

(52) U.S. Cl.
CPC ........ *H01L 21/02532* (2013.01); *C08G 77/56* (2013.01); *C09D 183/16* (2013.01);
(Continued)

(58) Field of Classification Search
CPC . H01L 21/26506; H01L 21/00; H01L 29/167; H01L 21/02532; H01L 27/1292;
(Continued)

(56) References Cited

U.S. PATENT DOCUMENTS 5,821,137 A  10/1998  Wakai et al.
6,527,847 B1  3/2003  Matsuki
(Continued)

FOREIGN PATENT DOCUMENTS

EP  1087428 A1  3/2001
JP  2000-031066 A  *  1/2000  ........... H01L 21/205
(Continued)

OTHER PUBLICATIONS http://www.chemspider.com/Chemical-Structure.63579.html.*
(Continued)

*Primary Examiner* — John P Dulka
*Assistant Examiner* — Charles R Peters
(74) *Attorney, Agent, or Firm* — Andrew D. Fortney; Central California IP Group, P.C.

(57) ABSTRACT

Doped semiconductor ink formulations, methods of making doped semiconductor ink formulations, methods of coating or printing thin films, methods of forming electronic devices and/or structures from the thin films, and methods for modifying and controlling the threshold voltage of a thin film transistor using the films are disclosed. A desired dopant may be added to an ink formulation comprising a Group IVA compound and a solvent, and then the ink may be printed on a substrate to form thin films and conductive structures/ devices, such as thin film transistors. By adding a customized amount of the dopant to the ink prior to printing, the threshold voltage of a thin film transistor made from the doped semiconductor ink may be independently controlled upon activation of the dopant.

20 Claims, 2 Drawing Sheets

Related U.S. Application Data

(60) Provisional application No. 61/022,479, filed on Jan. 21, 2008.

(51) Int. Cl.
*H01L 27/12* (2006.01)
*H01L 29/66* (2006.01)
*C09D 183/16* (2006.01)
*H01L 21/208* (2006.01)

(52) U.S. Cl.
CPC ...... *H01L 21/02628* (2013.01); *H01L 21/208* (2013.01); *H01L 27/1292* (2013.01); *H01L 29/66757* (2013.01)

(58) Field of Classification Search
CPC ......... H01L 21/02628; H01L 29/66757; H01L 21/208; C09D 183/16; C08G 77/56
See application file for complete search history.

(56) References Cited

U.S. PATENT DOCUMENTS

| | | | |
|---|---|---|---|
| 6,541,354 B1 | 4/2003 | Shimoda et al. | |
| 6,683,333 B2 | 1/2004 | Kazlas et al. | |
| 6,695,903 B1 | 2/2004 | Kübelbeck et al. | |
| 6,767,775 B1* | 7/2004 | Yudasaka et al. | 438/156 |
| 6,884,700 B2 | 4/2005 | Aoki et al. | |
| 7,314,513 B1* | 1/2008 | Zurcher | H01L 21/02532 106/287.14 |
| 2003/0229190 A1 | 12/2003 | Aoki et al. | |
| 2004/0029364 A1 | 2/2004 | Aoki et al. | |
| 2004/0248429 A1 | 12/2004 | Aoki | |
| 2006/0008956 A1 | 1/2006 | Yudasaka et al. | |

FOREIGN PATENT DOCUMENTS

| | | |
|---|---|---|
| JP | 2000031066 A | 1/2000 |
| JP | 2005219981 A | 8/2005 |
| WO | 0059015 A1 | 10/2000 |

OTHER PUBLICATIONS

International Searching Authority/Japanese Patent Office, Japan; PCT International Search Report for International Application No. PCT/JP00/01987, Corresponding to European Patent Application EP 1 087 428 A1; Dated Jul. 4, 2000; 2 pages; International Searching Authority/Japanese Patent Office, Japan.

Takashi Aoki; "Method of Preparing Higher Order Silane Solution, Method of Forming Silicon Film, Silicon Film, Thin Film Transistor (TFT), and Electro-Optic Device"; esp@cenet; Japanese Publication No. JP2005219981 (A); Publication Date: Aug. 18, 2005; esp@cenet Database—Worldwide, http://v3.espacenet.com/publicationDetails/biblio?adjacent=true&KC=A&date=20050818 . . . .

Tsutomu Takadera, Keiichi Fukuyama, Akira Sakawaki, Kotaro Yano and Yutaka Kitsuno; "Method for Forming Silicon Film and Manufacture of Solar Battery"; esp@cenet; Japanese Publication No. JP2000031066 (A); Publication Date: Jan. 28, 2000; esp@cenet Database—Worldwide, http://v3.espacenet.com/publicationDetails/biblio?adjacent=true&KC=A&date=20000128 . . . .

Tatsuya Shimoda, Satoru Miyashita, Shunichi Seki, Masahiro Furusawa, Ichio Yudasaka, Yasumasa Takeuchi and Yasuo Matsuki; "Method for Forming Silicon Film"; esp@cenet; World Publication No. WO00059015 (A1); Publication Date: Oct. 5, 2000; esp@cenet Database—Worldwide, http://v3.espacenet.com/publicationDetails/biblio?adjacent=true&KC=A1&date=200010 . . . .

International Searching Authority/Japanese Patent Office, Japan; PCT International Search Report for International Application No. PCT/JP00/01988, Corresponding to World PCT Patent Application WO0059015 (A1); Dated Jul. 4, 2000; 3 pages; International Searching Authority/Japanese Patent Office, Japan.

* cited by examiner

US 9,640,390 B1

METHOD FOR MODIFYING AND CONTROLLING THE THRESHOLD VOLTAGE OF THIN FILM TRANSISTORS

RELATED APPLICATIONS

This application is a divisional of U.S. patent application Ser. No. 12/357,065, pending, which claims the benefit of U.S. Provisional Application No. 61/022,479, filed Jan. 21, 2008, which is incorporated herein by reference in its entirety.

FIELD OF THE INVENTION

The present invention generally relates to the field of thin films, particularly continuous or patterned doped semiconductor thin films. More specifically, embodiments of the present invention pertain to doped semiconductor ink formulations, methods of making such ink formulations, methods of forming thin films from such ink formulations, and methods for modifying and controlling the threshold voltage of a thin film transistor (TFT) using the same.

BACKGROUND

Silicon films or features made by depositing cyclopentasilane or polycyclopentasilane are generally slightly n-type. This may be due to one or more factors that may include possible impurities such as oxygen or phosphorus, electronic crystal defects (e.g., that may be induced by power laser crystallization), gate oxide thickness/interface defects, channel doping, and/or gate-to-channel work function differences. Although the contribution from each factor varies with process parameters within a targeted integration scheme, it is desired to have control over centering the threshold voltage (Vt) of n-type and p-type thin film transistors (TFTs). This is usually achieved by altering the level of channel dopant in the active silicon layer.

In a traditional integration scheme, the Vt shift can be achieved by ion implantation of n-type or p-type dopant. This shifts the Vt to more negative or positive values, respectively. Ion implantation may be performed as a blanket process or a masked process, but nevertheless involves the addition of multiple extra steps and capital equipment, an increase in cycle time, and/or an introduction of defects and/or yield losses into the process flow.

SUMMARY OF THE INVENTION

Aspects of the present invention relate to ink formulations, methods of making such ink formulations, methods of forming lightly doped semiconductor films (e.g., lightly doped silicon films) from the ink formulations, methods of making devices (e.g., thin film transistors, capacitors, diodes, etc.) using such doped semiconductor films, and methods for modifying and controlling the threshold voltage (Vt) of a TFT using such ink formulations and thin films. Using the formulations and methods described herein provides for independent and variable control over a threshold voltage of N- and/or P-type TFTs. By forming physically independent channels (e.g., by printing), a predetermined and/or desired dopant concentration may be introduced into an ink prior to printing or coating. Upon electrical activation, independent control of the Vt may be achieved through doping by transistor location, type, or combinations thereof. In one example, Vt may be defined as a particular voltage at which a defined characteristic of an electronic device first appears at a defined, measurable level (e.g., the voltage at which conduction of current begins in a pn junction, the voltage at which channel formation occurs in a thin film transistor, etc.).

In one aspect, the present invention concerns an ink formulation that generally comprises a Group IVA compound containing at least five Si and/or Ge atoms, a dopant and/or dopant precursor in an amount effective to provide a film with a dopant atom concentration of from 0.1 to 50 ppm relative to the number of Group IVA atoms, and a solvent adapted to facilitate coating and/or printing of the formulation. In various embodiments, the Group IVA compound comprises a (cyclo)silane, oligosilane, or polysilane (e.g., cyclopentasilane, polytrisilane, polytetrasilane, etc.). Additionally, the dopant may comprise an N-type dopant or a P-type dopant, and in various embodiments, the solvent may be selected from the group consisting of linear alkanes, cycloalkanes, arenes, fluoroalkanes, and siloxanes.

In another aspect, the present invention relates to a method of making a doped silane ink. In general, a Group IVA (e.g., (poly)silane, germane, and/or silagermane) compound containing at least five Si and/or Ge atoms, is combined with a dopant and/or dopant precursor in an amount effective to provide a film with a dopant atom concentration of from 0.1 to 50 ppm, relative to the number of Si and/or Ge atoms, and a solvent. The silane, dopant, and solvent are then mixed to form a solution.

The present invention also relates to methods of making a doped semiconductor (e.g., silicon) film comprising the steps of (1) coating or printing a composition onto a substrate, the composition comprising a formulation including a Group IVA compound containing at least five Si and/or Ge atoms, a dopant in an amount effective to provide a film with a dopant atom concentration of from 0.1 to 50 ppm, relative to the number of Group IVA atoms, and a solvent; (2) heating the coated or printed composition sufficiently to form a doped amorphous, hydrogenated semiconductor; and (3) annealing and/or irradiating the doped, amorphous, hydrogenated semiconductor sufficiently to at least partially crystallize, reduce a hydrogen content of, and/or electrically activate the dopant in the doped, amorphous hydrogenated semiconductor and form the doped semiconductor film. Additionally, the doped semiconductor film may be patterned by photolithography and/or etching process known in the art. In other embodiments, the doped semiconductor may be patterned before being crystallized or activated by the annealing/irradiating process. The present invention also concerns methods of making a device, such as a thin film transistor, capacitor, diode, resistor, and/or circuit by forming such doped semiconductor (e.g., silicon) films on a substrate, and then forming a conductor on the doped semiconductor film.

A further aspect of the present invention concerns a method of controlling a threshold voltage of a thin film transistor comprising (1) making a semiconductor ink comprising a Group IVA compound containing at least five Si and/or Ge atoms, a dopant in an amount effective to provide a film with a dopant atom concentration of from 0.1 to 50 ppm, relative to the number of Group IVA atoms, and a solvent, (2) forming a film from the ink, and (3) activating the dopant in the film. In some variations, the composition may be irradiated with ultra-violet radiation, either simultaneously with or immediately subsequent to coating or printing the ink composition onto a substrate.

The present invention provides ink formulations, and method of making ink formulations, as well as methods of making thin films and electronic components from the ink formulations, and methods of modifying and controlling the threshold voltage of a TFT. The formulations and methods described herein enable independent and variable control over the threshold voltage of N- and P-type thin film transistors (TFTs). By depositing or printing ink formulations comprising different amounts of dopant, independent control of Vt can be achieved by transistor location, type, or combinations thereof after electrically activating the dopant. Thus, independent control of Vt can be achieved without performing additional implantation processes/steps. This results in a reduction in processing time, product defects, and the amount of capital equipment required for the process flow. By printing physically independent channels, embodiments of the present invention may independently tailor or customize the Vt's of different TFTs (e.g., of different type and/or function), or in some instances, individual TFTs, by depositing or printing a plurality of silicon inks containing different amounts of dopant. In one example, this is accomplished by printing different inks using an ink jet printer having multiple ink jet print heads. In another example, one may make multiple printing passes over a substrate. Once electrically activated, independent control of Vt through doping, by transistor location, type, or combinations thereof may be achieved.

These and other advantages of the present invention will become readily apparent from the detailed description of preferred embodiments below.

DETAILED DESCRIPTION OF THE PREFERRED EMBODIMENTS

Figure 1A:
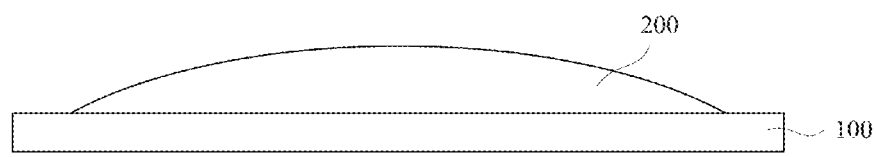
FIGS. 1A-1C are cross-sectional views of a transistor made according to a method of the present invention.

Reference will now be made in detail to preferred embodiments of the invention. While the invention will be described in conjunction with the following preferred embodiments, it will be understood that the description is not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

In the present invention, the term "deposit" (and grammatical variations thereof) is intended to encompass any and all forms of deposition, including blanket deposition (e.g., chemical vapor deposition (CVD) and physical vapor deposition (PVD), atomic layer deposition (ALD), slit coating, extrusion coating, meniscus coating, evaporation, etc.), (spin)coating, and printing. In various embodiments of the method of printing a functional electronic ink on a substrate, printing may comprise inkjetting, gravure printing, screen printing, offset printing, flexographic printing, spray-coating, microspotting, vapor-jetting, and/or pen-coating the ink formulation onto the substrate. Also, for convenience and simplicity, the terms "part," "portion," and "region" may be used interchangeably but these terms are also generally given their art-recognized meanings. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

In addition, the term "doped" refers to a material that is doped with any substantially controllable dose of any dopant (e.g., lightly doped, heavily doped, or doped at any doping level in between). Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties. Also, a "major surface" of a structure or feature is a surface defined at least in part by the largest axis of the structure or feature (e.g., if the structure is round and has a radius greater than its thickness, the radial surface[s] is/are the major surface of the structure; however, where the structure is square, rectangular or oval, the major surface of the structure is typically a surface defined by the two largest axes, generally the length and width, the values of which may vary across the structure). For the sake of convenience and simplicity, the terms "coupled to," "connected to," and "in communication with" (and variations thereof) mean direct or indirect coupling, connection or communication, unless the context clearly indicates otherwise. These terms are generally used interchangeably herein, and wherever one such term is used, it also encompasses the other terms, unless the context clearly indicates otherwise.

The term "silane" refers to a compound or a mixture of compounds that contains primarily or consists essentially of (1) silicon and/or germanium and (2) hydrogen, the term "polysilane" refers to a compound or a mixture of compounds that predominantly contains (1) at least 15 silicon and/or germanium atoms and (2) hydrogen, and the term "(poly)silane" refers to a compound or a mixture of compounds that includes one or more silanes and/or polysilanes. Such (poly)silane species (i.e., silane[s] and/or polysilane[s]) may contain one or more cyclic rings and be linear, branched or cross-linked. The term "(cyclo)silane" refers to a compound or a mixture of compounds that consists essentially of (1) silicon and/or germanium and (2) hydrogen, and that may contain one or more cyclic rings and less than 15 silicon and/or germanium atoms. The term "hetero(cyclo)silane" refers to a compound or a mixture of compounds that consists essentially of (1) silicon and/or germanium, (2) hydrogen, and (3) one or more dopant atoms such as B, P, As or Sb that may be substituted by a conventional hydrocarbon, silane or germane substituent and that may contain one or more cyclic rings. Such (poly) silane(s), (cyclo) silane(s) and/or hetero(cyclo)silane(s) may also contain an amount or atomic percentage of halogen atoms (such as Cl) that does not have a significant adverse effect on the properties of a given composition, a film formed therefrom, and/or devices containing such a film for a particular application.

For the sake of convenience and simplicity, the terms "$C_a$-$C_b$ alkyl," "$C_a$-$C_b$ alkoxy," etc. shall refer to both linear and, when the range from a to b encompasses three (3) or more carbon atoms, branched groups. Unless otherwise indicated, the terms "cyclo-" and "cyclic" refer to both mono- and polycyclic species. For the sake of brevity, the terms "halo-," "halogen," "halide" and grammatical derivations thereof may describe halogens as defined in the Periodic Table of Elements (F, Cl, Br, and I) and halogen-like species (e.g., species that form stable monovalent anions, often called pseudohalides) such as methanesulfonate (OMs), trifluoromethanesulfonate (OTf), toluenesulfonate (OTs), hexafluorophosphate ($PF_6$), tetrafluoroborate ($BF_4$), etc.

The present invention concerns ink formulations, methods of making ink formulations, methods of making doped semiconductor films and electronic components/devices from such ink formulations, and methods of modifying and/or controlling a threshold voltage of a thin film transistor.

One aspect of the present invention concerns an ink formulation generally comprising a Group IVA compound containing at least five Si and/or Ge atoms, a dopant in an amount effective to provide a film with a dopant atom concentration of from 0.1 to 50 ppm relative to the number of Group IVA atoms, and a solvent. In some embodiments, the Group IVA compound comprises a silane or polysilane, and the dopant may be a P-type or an N-type dopant. Additionally, the present invention is not limited to ink formulations (and structures formed therefrom) including a single dopant or dopant precursor. The present ink formulations may include one or more dopant(s) and/or dopant precursors. Such ink formulations may be made by combining a silane, germane, and/or silagermane compound containing at least five Si and/or Ge atoms, a dopant in an amount effective to provide a film with a dopant atom concentration of from 0.1 to 50 ppm, relative to the number of Si and/or Ge atoms, and a solvent, and then mixing the combination to form a solution.

A further aspect of the present invention concerns a method of forming a doped semiconductor film using the ink formulation(s) described herein. The method generally comprises the steps of (a) coating or printing a composition on a substrate, the composition comprising a formulation including a Group IVA compound containing at least five Si or/or Ge atoms, a dopant in an amount effective to provide a film with a dopant atom concentration of from 0.1 to 50 ppm, relative to the number of Group IVA atoms, and a solvent; (b) heating the coated or printed composition sufficiently to form a doped amorphous, hydrogenated semiconductor, and (c) annealing and/or irradiating the doped, amorphous, hydrogenated semiconductor sufficiently to at least partially crystallize, reduce a hydrogen content of, and/or electrically activate the dopant in the doped, amorphous, hydrogenated semiconductor and form the doped semiconductor film. In exemplary embodiments, the doped semiconductor film may be patterned by photolithography and/or etching process after annealing and/or irradiating the semiconductor, or in the alternative, the doped semiconductor may be patterned before the annealing/irradiating process.

In some implementations, the method may further comprise irradiating the composition with ultra-violet (UV) radiation, either simultaneously with or immediately subsequent to coating or printing the composition onto the substrate. The composition may be printed onto a substrate in patterned lines, islands, and/or other features and printing may comprise inkjetting, gravure printing, off-set lithography, screen printing, flexographic printing, microspotting, pen-coating, syringe dispensing, and/or pump dispensing the ink composition.

Another aspect of the present invention relates to methods of making a thin film transistor (TFT), a capacitor, a diode, a resistor device, and/or a circuit. According to various embodiments, such structures and/or devices may be made by forming a doped semiconductor film on a substrate using the methods described herein, and then forming a conductor on the doped semiconductor film. The conductor may comprise a metal, and may be formed by printing a metal and/or metal precursor ink onto the semiconductor film and the substrate. In preferred implementations, the TFT, capacitor, diode, resistor, circuit, or other device has a domed cross-sectional profile that results from printing the doped semiconductor on the substrate.

The threshold voltage (Vt) of a TFT or other device may be controlled by forming a semiconductor ink having a formulation according to any of the embodiments described herein, and forming a film from the ink using any of the methods described herein. After the film is formed, the dopant in the film is activated. In various embodiments, the dopant may be activated by thermal and/or laser annealing.

The invention, in its various aspects, will be explained in greater detail below with regard to exemplary embodiments.

Exemplary Ink Formulations

A first aspect of the present invention relates to ink formulations. The formulation generally comprises a Group IVA compound containing at least five Si and/or Ge atoms, a dopant in an amount effective to provide a film with a dopant atom concentration of from 0.1 to 50 ppm relative to the number of Group IVA atoms, and a solvent. In exemplary embodiments, the Group IVA compound comprises a silane, germane, or silagermane compound. Furthermore, the dopant may comprise either a P-type or an N-type dopant, such as a boron and/or phosphorus compound. Also, the solvent is preferably adapted to facilitate printing (e.g., inkjet printing, gravure, etc.) of the formulation. In exemplary implementations, the Group IVA compound (e.g., silane) is present in an amount of from about 0.1 to 50 wt. %, 1 to 20 wt. % of the formulation, or any other range of values therein.

In various embodiments, the Group IVA compound comprises a silane, cyclosilane, polysilane, and/or any corresponding germane or silagermane compound that contains at least five Si and/or Ge atoms. In exemplary implementations, the Group IVA compound may comprise a cyclic compound such as cyclopentasilane. In other exemplary variations, the Group IVA compound comprises a polysilane and/or (poly)silane precursor having at least 5, at least 15, or at least 25 Si and/or Ge atoms (e.g., from 5 to 1,000,000, 20 to 1,000,000, 20 to 1,000, 15 to 250, or any other range of values ≥5 or ≥15). Further examples of compounds suitable for use in the present invention are disclosed in U.S. Pat. No. 7,314,513, and U.S. patent application Ser. Nos. 10/616,147 and 11/867,587, filed Jul. 8, 2003 and Oct. 4, 2007, respectively.

The Group IVA compound may comprise a polymer of (or formed from) a compound of the formula $A_nH_{2n+2}$ and/or $A_mH_{2m}$ where A is Si and/or Ge, n is an integer from 1 to 8, and m is an integer from 4 to 8. In exemplary embodiments, the Group IVA compound may comprise a polymer of $Si_nH_{2n+2}$ and/or $Si_mH_{2m}$ (e.g., a polysilane formed from $Si_nH_{2n+2}$ and/or $Si_mH_{2m}$ monomers), where n is an integer from 3 to 7 and m is an integer from 4 to 8. Such polymers may be linear, branched and/or crosslinked, and may contain one or more cyclic rings therein. For example, the polysilane may comprise a polymer of one or more monomers selected from the group consisting of trisilane, tetrasilane, pentasilane, hexasilane, heptasilane, and cyclopentasilane (e.g., a polysilane may be selected from the group consisting of polytrisilane, polytetrasilane, polypentasilane, polyhexasilane, polyheptasilane, and polycyclopentasilane). In alternative embodiments, the Group IVA compound may comprise a polymer of $Si_pGe_qH_{2n+2}$, $Si_rGe_sH_{2m+2}$, and/or $Ge_mH_{2m}$ (or comprise a polygermane or polysilagermane formed from such monomers), where n is an integer from 3 to 7, (p+q)=n, m is an integer from 4 to 8, and (r+s)=m. Methods of forming the Group IVA compounds described in this paragraph are disclosed in copending U.S. patent application Ser. Nos. 10/616,147 and 11/867,587, filed on Jul. 8, 2003 and Oct. 4, 2007, respectively, the relevant portions of which are incorporated by reference herein. Other linear, cyclic, polycyclic, cross-linked or branched (poly)silanes, and germane and silagermane analogs thereof, as well as techniques for making and/or polymerizing the same are disclosed in U.S. Pat. Nos. 7,422,708 and 7,314,513, the relevant portions of each of which are incorporated herein by reference.

In embodiments where the formulation comprises a Group IVA polymer, the polymer may have an atomic purity of greater than 90% with respect to silicon, germanium and hydrogen (i.e., greater than 90% of the atoms in the polymer are Si, Ge or H). Alternatively, the formulation comprises a (poly)silane that has an atomic purity of greater than 90% with respect to silicon and hydrogen. Thus, the polymer or (poly)silane may contain up to 10 at. % of other species (such as boron, gallium, phosphorous, arsenic, antimony, halogens [e.g., F, Cl, Br, etc.], carbon, oxygen, nitrogen, etc.), as long as the other species do not significantly adversely affect the electrical properties of a film formed from the (poly)silane for a given application. Preferably, however, the polymers and (poly)silanes have an atomic purity of at least 95%, at least 99%, or any minimum value above 90 at. %, with respect to silicon (or silicon and germanium) and hydrogen. In preferred embodiments, the purity is at least 99.9% with respect to Si, Ge and/or H, or Si and H.

The dopant used in the formulation may comprise a P-type or an N-type dopant. In general, the dopant may be present in an amount sufficient to provide a film with a dopant atom concentration of from 0.1 to 50 ppm relative to the number of Group IVA atoms. In one exemplary embodiment, the dopant is present in an amount sufficient to provide a film with a dopant atom concentration of from 1 to 5 ppm relative to the number of Group IVA atoms, but any range within the 0.1-50 ppm range may be acceptable. Preferably, the dopant is present in an amount sufficient to control the threshold voltage of a thin film transistor. In preferred embodiments, the dopant has a boiling point greater than 150° C.

In formulations where the dopant comprises a P-type dopant, the dopant preferably comprises a boron compound. For example, the dopant may comprise an organoborane having the formula $BR_3$ or $B_2R_6$. In such formulations, each R is independently selected from the group consisting of $C_1$-$C_{10}$ alkyl, $C_6$-$C_{10}$ aryl, $C_6$-$C_{10}$ aryl substituted with 1 to 3 $C_1$-$C_4$ alkyl groups, $C_7$-$C_{12}$ aralkyl, halogen, hydrogen, $GeR'_3$, $SiR'_3$ and $Si_xH_{2x+1}$, where R' is independently hydrogen, halogen, $C_1$-$C_{10}$ alkyl, $C_6$-$C_{10}$ aryl, $C_6$-$C_{10}$ aryl substituted with 1 to 3 $C_1$-$C_4$ alkyl groups, $C_7$-$C_{12}$ aralkyl, or $Si_xH_{2x+1}$, and x is an integer of from 1 to 10, such that the combined R and/or R' groups include at least 6 carbon atoms per boron atom. In various embodiments, the organoborane comprises triethylborane, tributylborane (e.g., tri-n-butylborane or tri-t-butylborane) or triphenylborane. In alternate embodiments, the P-type dopant comprises an aminoborane. For example, the P-type dopant may have the formula $B(NR_2)_3$, wherein each R is independently selected from the group consisting of $C_1$-$C_{10}$ alkyl, $C_6$-$C_{10}$ aryl, $C_6$-$C_{10}$ aryl substituted with 1 to 3 $C_1$-$C_4$ alkyl groups, $C_7$-$C_{12}$ aralkyl, halogen, and hydrogen. In other embodiments, the P-type dopant may comprise an inorganic borane such as a hydroborane (e.g., $B_2H_6$, $B_5H_9$, $B_6H_{10}$, $B_6H_{12}$, $B_9H_{15}$, $B_{10}H_{14}$, $B_{10}H_{16}$, $B_{13}H_{19}$, $B_{16}H_{20}$, or $B_{20}H_{26}$), a hydroborane complex (e.g., $BH_3.N[C_2H_5]_3$, $BH_3.N[CH_3]_3$, $BH_3.S[CH_3]_2$, borane tetrahydrofuran complex, etc.), a organoborane complex (e.g. $BMe_3.N[CH_3]_3$, $BHMe_2.N[C_2H_5]_3$, $BEt_3.N[CH_3]_3$, $BH_2Et.N[CH_3]_3$, etc.), a haloborane (e.g., $BCl_3$, $BBr_3$) or a haloborane complex (e.g., $BF_3.H_2NC_2H_5$, $BBr_3.S[CH_3]_2$, boron trifluoride diethyl ether complex, boron tribromide tetrahydrofuran complex, etc.). In some exemplary implementations, the formulation may comprise a doped polysilane. In such embodiments, the ink may consist essentially of a chain of at least 10 Si and/or Ge atoms, hydrogen, and one or more dopant atoms (which may further include one or more alkyl, aryl, substituted aryl, aralkyl, silyl, germyl, aryl-substituted silyl or aryl-substituted germyl substituents thereon). For example, the ink formulation may comprise $DR_3$, where D=B, P, As or Sb; $R=Si_xH_y$, x>10, and y is an odd number of from (x−1) to (2x+1). Optionally, the doped polysilane may also include an amount or an atomic percentage or ratio of halogen atoms (such as Cl) that does not have a significant adverse effect on the properties of a given composition for a particular application.

In various embodiments, the dopant may comprise an N-type dopant such as a phosphorous compound, an arsenic compound, or an antimony compound. In some implementations, the N-type dopant comprises an organophosphine, an organoarsine and/or an organostibine. In exemplary embodiments, the dopant comprises a phosphine of the formula $PR_3$, where each R is independently selected from the group consisting of $C_1$-$C_{10}$ alkyl, $C_6$-$C_{10}$ aryl, $C_6$-$C_{10}$ aryl substituted with 1 to 3 $C_1$-$C_4$ alkyl groups, $C_7$-$C_{12}$ aralkyl, halogen, hydrogen, $GeR'_3$, $SiR'_3$ and $Si_xH_{2x+1}$, where R' is independently hydrogen, halogen, $C_1$-$C_{10}$ alkyl, $C_6$-$C_{10}$ aryl, $C_6$-$C_{10}$ aryl substituted with 1 to 3 $C_1$-$C_4$ alkyl groups, $C_7$-$C_{12}$ aralkyl, or $Si_xH_{2x+1}$, where x is an integer of from 1 to 4. In various embodiments, the organophosphine comprises t-butylphosphine, di(t-butyl)phosphine, tri(t-butyl)phosphine or triphenylphosphine. In some variations, the N-type dopant comprises a phosphine oxide compound, such as $P(=O)X_3$, $P(=O)R_3$, $P(OR)_3$, $P(=O)(NR_2)$, or $P(=O)(OR_3)$, where X is a halogen and R is as described above (preferably an alkyl or aryl group, or where two R groups form an alkylene or arylene group). Elemental N-type dopants such as red phosphorus or white phosphorus, or in the alternative, hydrogen compounds comprising N-type dopants such as phosphanes, arsanes, and/or stibanes may also be employed.

In general, the concentration of dopant in the formulation is relatively low. Therefore, dopants with relatively low solubility in the ink solvent may be used so long as their solubility is higher than the targeted doping concentration (e.g. 1-100 ppm, preferably 1-10 ppm). Dopants with relatively low solubility in the solvent used for the ink formulation may be dissolved in a second solvent in which the dopant has high solubility (e.g. $CH_2Cl_2$, diethyl ether, tetrahydrofuran), so that a small amount of the dopant solution can be added to a relatively large amount of the ink formulation. The second/different solvent can be subsequently removed from the ink formulation (e.g. by vacuum or azeotropic distillation). Thus, exemplary dopants may include inorganic compounds such as boric acid, boron oxide, borate salts (e.g., alkali metal or ammonium borates), boron halides (e.g. $BCl_3$, $BBr_3$, etc.) phosphoric acids and/or phosphorous oxides (e.g., $H_3PO_4$, $P_2O_5$, $P_4O_{10}$, etc.), phosphate salts (e.g., alkali metal or ammonium phosphates), phosphorous halides and oxyhalides (e.g., $PCl_3$, $PCl_5$, $POCl_3$, etc.), etc. Other exemplary dopants, and preferred dopant concentrations in inks and films formed therefrom are discussed further herein with regard to exemplary methods of controlling threshold voltage below.

In general, there is a relationship between the dopant concentration in the ink formulation and the dopant concentration or dose in the film formed from the ink formulation. For example, the incorporation efficiency of the dopant in the resulting film may depend on various factors (e.g., the amount of dopant in the original ink composition, the dopant dilution factor in the formulation, the silicon precursor, the curing, annealing and/or activation conditions, etc.). In general, the dopant incorporation efficiency should be determined empirically for a given process and/or ink formulation. However, the dopant incorporation efficiency is very predictable as long as the incorporation factors (e.g., silicon source, dilution factor, annealing and other process conditions, etc.) are controlled and remain substantially constant.

The solvent suitable for use in the present ink formulation may be one that is adapted to provide a relatively high degree of stability to the ink composition, provide an advantageous viscosity and volatility (e.g., adapted to facilitate coating and/or printing of the formulation, sufficient to prevent nozzle clogging and allow printed ink to dry at relatively low temperatures and relatively short times) and/or that is generally easily and/or thoroughly removable from the composition. For example, the solvent preferably is one that is substantially completely removed by depositing or printing the ink at a temperature of 15-90° C., followed by heating for 10 min at 100° C. and/or is one that is generally liquid at ambient temperatures (e.g., 15-30° C.).

Specifically, characteristics and/or properties that are considered optimal to facilitate printing include a viscosity of at least 2 cP (e.g., 2 to 100 cP, 4 to 15 cP, or any other range of values therein), a boiling point of at least 150° C. (e.g., 150 to 250° C., or any minimum value in the range), and/or a surface tension of at least 20 dynes/cm (e.g., at least 25 dynes/cm, from 25 dynes/cm to about 100 dynes/cm, or any other minimum value in the range). Although the present formulation may contain one or more solvent(s) that do not possess such characteristics and/or properties, preferably, the solvent(s) used in the formulation has at least one such characteristic and/or property.

In preferred embodiments, the solvent is selected from the group consisting of linear alkanes, cycloalkanes (e.g., monocycloalkanes, bicycloalkanes such as norbornane or cis- or trans-decalin, or polycycloalkanes such as tetrahydrodicyclopentadiene), arenes, fluoroalkanes, and siloxanes. In one embodiment, the solvent is selected from the group consisting of $C_5$-$C_{12}$ cycloalkanes and $C_6$-$C_{10}$ arenes. In another embodiment, the solvent is a $C_6$-$C_{10}$ cycloalkane. The solvent in the present formulation may also comprise a mixture of one or more such organic solvents.

The composition may further comprise one or more additives, such as a surface tension reducing agent, a surfactant, a binding agent, a thickening agent, a photosensitizer, etc. Preferably, however, the composition is free or substantially free from additives and/or other components that may introduce atoms or other species that may adversely affect the electrical properties of a thin film formed from the composition (e.g., carbon, oxygen, nitrogen, alkali metals, etc.). When they are present, typical amounts of the additives in the composition are from 0.01 wt. % to 10 wt. % (e.g., in trace amounts, or from 0.1 wt. % to 5 wt. %) of the composition. Additives appropriate for use in the present formulation are described in detail in copending U.S. patent application Ser. No. 12/243,880, filed on Oct. 1, 2008, the relevant portions of which are incorporated by reference herein. However, it is generally advantageous to exclude such additives from the ink formulation, particularly where such additives include sufficiently high molar proportions of elements such as carbon, oxygen, sulfur, or nitrogen to adversely affect electrical properties of the resulting thin film.

Exemplary Methods of Making an Ink Formulation

The above-described general doped semiconductor ink formulation, and the variations and embodiments thereof, may be made according to a method generally comprising combining a Group IVA (e.g., silane, germane, and/or silagermane) compound containing at least five Si and/or Ge atoms, a dopant in an amount effective to provide a film with a dopant atom concentration of from 0.1 to 50 ppm (or any range of values therein, such a 1 to 5 ppm), relative to the number of Si and/or Ge atoms, and a solvent, and then mixing the silane, dopant, and solvent to form a solution. The solvent(s) may preferably be adapted to facilitate printing (especially inkjet printing) of the formulation. In the present method of making a formulation, the Group IVA compound, the dopant(s), the solvent(s), and optionally any additional additive(s) are substantially the same as described herein for the formulation itself (see, e.g., the "Exemplary Ink Formulations" above).

The components of the ink formulation may be combined in any order. The components may be mixed by mechanical stirring, magnetic stirring, shaking or other form of physical agitation, blending, etc. The ink is preferably formulated under an inert atmosphere (preferably Ar, rather than $N_2$) with $O_2$ levels $\ll 1$ ppm to avoid unacceptably high oxygen content in the formed films. Because of the low doping level (e.g., 0.1-50 ppm), the ink is preferably formulated using a dilute solution of dopant in the ink solvent, prepared by multiple dilutions. For example, a solution of dopant in a solvent having an initial concentration ranging from about 0.001-1 M (e.g., from 0.01 to 0.1 M, or any other range of values therein) may be diluted multiple times (e.g., from 2 to 10 times) with solvent and/or a similar or otherwise identical solution without the dopant to achieve a diluted dopant solution with a final concentration that is about 10-1000 times (e.g., from 50 to 200 times, and in one implementation, about 100 times) lower than the initial concentration. The diluted dopant solution may then be used to formulate the ink composition. The amount of diluted dopant solution used in the ink formulation may be sufficient to provide a concentration of dopant atoms of about 0.1-50 ppm. In embodiments where the ink includes one or more components that are light- and/or heat-sensitive, the ink may be protected from light and/or heat by storing in an amber vessel, wrapping the vessel in aluminum foil or other light-blocking material, and/or storing in a freezer (e.g., at a temperature of about −20° C., about −40° C., or other temperature below 0° C.) or other cryogenic container or equipment (e.g., in an insulated container at least partially filled with dry ice, in an apparatus adapted for storage and cooling with liquid nitrogen, etc.).

Exemplary Methods of Forming Doped Films

A further aspect of the invention relates to a method of forming a doped semiconductor (e.g., doped silicon) film, by coating or printing the above ink composition onto a substrate. In preferred embodiments, the composition comprises a formulation including a Group IVA compound containing at least five Si and/or Ge atoms, a dopant in an amount effective to provide a film with a dopant atom concentration of from 0.1 to 50 ppm, relative to the number of Group IVA atoms, and a solvent. Next, the coated or printed composition is heated sufficiently to form a doped, amorphous, hydrogenated semiconductor. Then the doped, amorphous, hydrogenated semiconductor is annealed and/or irradiated sufficiently to at least partially crystallize, reduce a hydrogen content of, and/or electrically activate the dopant in the doped, amorphous, hydrogenated semiconductor and form the doped semiconductor film. In various implementations, the doped semiconductor film may be patterned by conventional photolithography and/or etching process. Furthermore, the doped semiconductor may be patterned prior to the annealing/irradiating process.

In general, coating refers to a process where substantially the entire surface of a substrate is covered with the formulation to form a continuous film. Coating may comprise spin coating, inkjetting, gravure printing, vapor jetting, flexographic printing, dip-coating, spray-coating, slit coating, extrusion coating, meniscus coating, microspotting and/or pen-coating the formulation onto the substrate. In some embodiments, blanket-depositing or coating the formulation on the substrate preferably comprises spincoating or extrusion coating.

Printing generally refers to a process for selective deposition of a liquid-based composition (e.g., a solution, suspension, emulsion, etc.) in a predetermined pattern and with a characteristic resolution (e.g., minimum layout dimension, spacing, alignment margin of error, combination thereof, etc.), including processes such as inkjetting, gravure printing, screen printing, offset printing, flexographic printing, microspotting, vapor-jetting, and/or pen-coating, although many such printing processes can also be used to form a continuous film. In exemplary embodiments, the printing step comprises inkjet printing, screen printing or gravure printing, and the ink formulation may be printed in a pattern on the substrate.

The coated or printed ink composition forming the semiconductor film may comprise any of the formulations described herein (see, e.g., the "Exemplary Ink Formulations" above). Furthermore, the ink composition/formulation may be made using any of the methods described herein (see, e.g., the "Exemplary Methods of Making an Ink Formulation" above).

In some implementations, the method may further comprise irradiating the ink composition with ultra-violet (UV) radiation, either simultaneously with or immediately subsequent to coating or printing the composition onto the substrate. Optionally, the present coating or printing method may further comprise drying (i.e., removing the solvent[s] from) the coated or printed formulation. In some embodiments, the drying process comprises heating the coated or printed metal precursor film to a temperature and/or for a length of time sufficient to remove substantially all of the solvent(s). In other embodiments, drying may comprise removing the solvent(s) at reduced pressure (e.g., in a vacuum), with or without applied heat. In any such embodiments, the temperature may be from 15° C. to 150° C., 50° C. to 100° C., or any value or range of values therein. The length of time may be sufficient to remove substantially all of the solvent(s) and/or substantially all of the additive(s) that may be present from the coated or printed semiconductor precursor film (e.g., from 1 minute to 4 hours, 5 minutes to 120 minutes, or any other range of values therein). In embodiments in which the drying process comprises removing the solvent(s) at reduced pressure, the pressure may be from 1 mtorr to 300 torr, 100 mtorr to 100 torr, 1-20 torr, or any other range of values therein, and may be applied and/or maintained by vacuum pump, aspirator, venturi tube, etc. The solvent is preferably removed under an inert atmosphere (preferably Ar, rather than $N_2$) with $O_2$ levels <<1 ppm to avoid unacceptably high oxygen content in the formed films.

In some embodiments, the printing process may be conducted under an inert and/or reducing atmosphere. In such embodiments, printing may include evacuating the atmosphere in which the substrate is placed, and subsequently introducing an inert and/or reducing gas into the vessel containing the substrate, prior to printing. In various embodiments, the inert gas may comprise He, Ar, $N_2$, etc., and the reducing gas may comprise $H_2$, $NH_3$, $SiH_4$, and/or other source of gas-phase reducing agent (e.g., in an amount up to about 20 vol. %). The inert and/or reducing gas atmosphere may prevent or reduce the incidence of inadvertent and/or undesired oxide formation. For example, the composition may be printed under an inert atmosphere (preferably with $O_2$ levels <<1 ppm) to avoid unacceptably high oxygen content in the formed films, which may result in poor device performance. In one embodiment, the inert atmosphere consists essentially of Ar, and may further include less than 0.1 ppm $O_2$ and less than 100 ppm $N_2$.

After coating/printing and drying the ink composition, the ink formulation is heated (e.g., cured) to form a doped, amorphous, hydrogenated semiconductor (e.g., a-Si:H). The heating/curing step may remove unwanted precursor/ink components, solvents and/or byproducts such as volatile carbon-containing species, and, in the case of a semiconductor precursor ink, reduce the hydrogen content of the amorphous, hydrogenated semiconductor (e.g., a-Si:H) layer. Reducing the hydrogen content of the amorphous, hydrogenated semiconductor is particularly advantageous if laser crystallization is to be used for dopant activation and or film crystallization after the initial semiconductor film formation. In the case of an ink containing (poly)silanes, curing generally comprises heating the dried composition to a temperature of at least about 300° C. (preferably at least about 350° C., and more preferably at least about 400° C.) for a length of time sufficient to convert the composition to a doped amorphous, hydrogenated film comprising silicon and/or germanium. Such heating may be conducted for a length of time of at least 1 minute, 3 minutes or 5 minutes. While this step may also activate part of the dopant in the semiconductor ink formulation, in most embodiments, dopant activation occurs during a subsequent irradiating and/or a relatively high-temperature annealing step.

The doped, amorphous, hydrogenated semiconductor may then be annealed or irradiated at a temperature sufficiently high and/or for a time sufficiently long to at least partially crystallize, reduce a hydrogen content of, and/or electrically activate the dopant in the doped, amorphous, hydrogenated semiconductor, and thus form the doped semiconductor film with certain predetermined characteristics or qualities (e.g., minimum conductivity, morphology, electromigration and/or etch resistance characteristics, stress and/or surface strain, etc.). Annealing may be conducted in a conventional furnace or oven, and optionally in an inert or reducing atmosphere. In exemplary embodiments, the formulation is heated to a temperature of from about 600° C. or more in a furnace, generally for a length of time of at least about 20 minutes. Such conditions are generally sufficient to substantially dehydrogenate and/or crystallize the doped amorphous silicon and/or germanium film.

In alternate embodiments, the ink may be irradiated with light to form the doped semiconductor film. The light sources appropriate for such irradiation may be UV or non-UV sources. For example, non-UV radiation sources may include broad-spectrum (e.g., w-filament) light sources, Xe lamps, visible LEDs, UV LEDs coated with down-converting phosphors, IR lamps (e.g., when the ink formulation comprises one or more IR dye[s]), and lasers, visible lasers, etc., including sources of UV radiation having one or more UV filters positioned between the lamp output and the composition to be irradiated. Suitable sources of UV radiation may comprise essentially any UV radiation source, such as a mercury vapor and/or mercury arc lamp, a UV LED, a UV laser (e.g. excimer laser), etc., or a broad-spectrum light source or other non-UV source having one or more visible and/or IR filters positioned between the lamp output and the sample to be irradiated, etc. For ink formulations comprising a (poly)silane, the preferred wavelength (or wavelength band) is in the range of 200 nm to 600 nm (e.g., 220 nm to 550 nm, 300 to 530 nm, or any other range of values therein).

The radiation dose may be in the range of 0.01 mJ/cm$^2$ to 2.5 J/cm$^2$, using a light source with a power output of about 0.1-15, 0.75-10 or 1-5 watt/cm$^2$ (or any other range of values therein), which may be transmitted directly or through a light guide or a slit, and/or which may be focused at the location of the substrate and/or the printed Group IVA (e.g., (poly)silane) ink formulation. To selectively irradiate only certain areas of the printed ink, the radiation from the lamp may be passed through a mask (e.g., a quartz plate having a chrome pattern thereon, which generally blocks UV radiation in areas where no exposure of printed (poly)silane ink is desired). The irradiating step is optionally conducted under an inert and/or reducing gas, to reduce any incidence of inadvertent and/or undesired oxide formation.

While any form of radiation (and more particularly, any wavelength of light) may be used, the irradiating step preferably comprises irradiating with ultraviolet light. Such irradiation may also yield a microcrystalline and/or polycrystalline doped semiconductor film. Thus, the present invention may provide commercial quality lightly doped semiconductor features (e.g., semiconductor islands) from a printed liquid Group IVA (e.g., [poly]silane) composition.

Exemplary Methods of Forming Electrical Components/Devices

Electrical components and/or devices (e.g., TFTs, capacitors, diodes, resistive devices [such as resistors], circuits, RFID tags, display backplanes, sensor and/or photovoltaic devices, etc.) may be formed by depositing a semiconductor film on a substrate, and then forming a conductor/conductive structure on the semiconductor film. The semiconductor film may be formed from any of the ink compositions described herein (see, e.g., "Exemplary Ink Formulations" above), and using any of the methods described herein (see, e.g., "Exemplary Methods of Forming Doped Silicon Films" above).

In exemplary embodiments, the conductor comprises a metal, and is formed by printing a metal ink and/or metal precursor ink onto the semiconductor film and the substrate. For example, the metal ink may comprise a metal precursor material and a solvent adapted to facilitate printing of the metal ink formulation (e.g., a "metal ink solvent"). The metal precursor material may comprise metal nanoparticles having a diameter of from 0.1 to 40 nm and/or a Group 4, 5, 6, 7, 8, 9, 10, 11, or 12 metal salt or metal complex. The solvent generally comprises one or more organic solvents adapted to facilitate coating and/or printing of the formulation. In certain embodiments, a second metal may be plated (e.g., e.g., by electroless or electroplating) on the metal film formed from the metal-containing ink (see, e.g., copending U.S. patent application Ser. No. 12/175,450, filed on Jul. 17, 2008, the relevant portions of which are incorporated by reference herein). Alternatively, the metal may be blanket-deposited (e.g., by sputtering), then patterned by conventional photolithography and etching.

Metals that may be deposited by such methods include elemental metals, such as aluminum, titanium, vanadium, chromium, molybdenum, tungsten, iron, nickel, palladium, platinum, copper, zinc, silver, gold, etc.; conventional alloys of such elements, such as aluminum-copper alloys, aluminum-silicon alloys, aluminum-copper-silicon alloys, titanium-tungsten alloys, Mo—W alloys, aluminum-titanium alloys, etc.; and electrically conductive metal compounds, such as the nitrides and/or silicides of elemental metals (e.g., titanium nitride, titanium silicide, tantalum nitride, tungsten nitride, tungsten silicide nitride, molybdenum silicide, cobalt silicide, nickel silicide, platinum silicide, etc.). In some embodiments, an ink comprising nanoparticles of one or more of the metals disclosed above and a solvent may be printed in a pattern corresponding to the metal layer to be formed. After printing the ink, the ink may be dried and laser-patterned to form the metal layer (see, e.g., copending U.S. patent application Ser. No. 11/203,563, filed on Aug. 11, 2005, the relevant portions of which are incorporated by reference herein). In other embodiments, the ink may be blanket deposited (e.g., by spin-coating), then (optionally) laser-patterned. Also, whether the metal ink is blanket-deposited or printed, the method may further comprise the step of curing or annealing the metal nanoparticles.

Alternatively or additionally, the metal ink formulations may comprise one or more metal precursors such as (organo)metallic compounds, complexes, and/or clusters, or combinations thereof with nanoparticles of one or more metals. Such metal compounds, complexes, clusters and/or nanoparticles may be combined with ligands, passivating agents, complexing and/or coordinating species, or other species that are capable of providing an electrically active film upon further processing of the ink. Other suitable printable metal ink formulations, methods of forming such formulations, and method of forming thin films from metal inks/metal ink precursors are described in detail in copending U.S. patent application Ser. No. 12/131,002, filed on May 30, 2008, the relevant portions of which are incorporated by reference herein.

A metal-containing ink (and, for that matter, any other printable ink disclosed herein) may be printed by essentially any conventional printing technology. For example, printing may comprise inkjet printing ("inkjetting"), screen printing, gravure printing, offset printing, flexography (flexographic printing), spray-coating, slit coating, extrusion coating, meniscus coating, microspotting, pen-coating, stenciling, stamping, syringe dispensing and/or pump dispensing the metal-containing ink in a predefined pattern. The ink may comprise or consist essentially of the Group IV compound and/or metal precursor material and a solvent.

In some embodiments comprising printed films, the doped semiconductor film and conductor described herein has a smooth and/or dome-shaped cross-sectional profile. This may be accomplished by employing printing techniques and/or inks that form features having such a profile. A detailed description of forming semiconductors, conductors and other conductive features having a smooth and/or dome-shaped profile, and the advantages of such structures, are described in detail in copending U.S. patent application Ser. No. 12/243,880, filed on Oct. 1, 2008, the relevant portions of which are incorporated by reference herein.

Figure 1B:
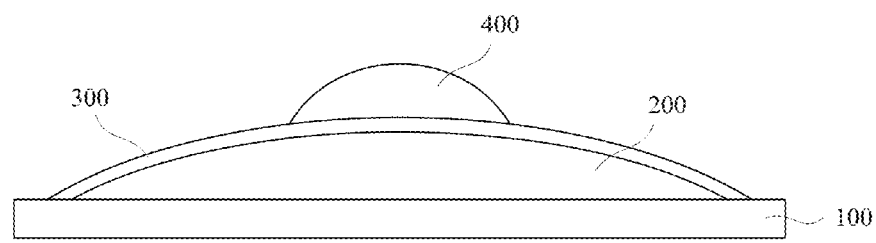
Figure 1C:
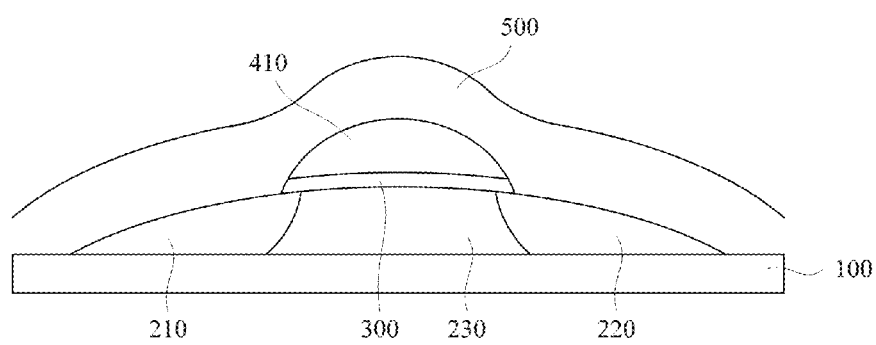

An exemplary transistor (e.g., TFT) manufactured according to embodiments of the present invention is shown in FIGS. 1A-1C. In FIG. 1A, a lightly doped semiconductor layer (e.g., silicon) 200 is formed on a substrate 100 by printing an ink containing a Group IVA compound and a dopant as described above. As shown in FIG. 1B, a gate dielectric layer 300 is formed on the semiconductor layer 200. The gate dielectric layer 300 may be formed by wet or dry thermal oxidation, gas-phase deposition (e.g., CVD, PECVD, HDP-CVD, etc.), or liquid-phase deposition (e.g., see copending U.S. patent application Ser. Nos. 11/452,108, 11/818,078, 11/888,942, 11/888,949, and 11/842,884, filed on Jun. 12, 2006, Jun. 12, 2007, Aug. 3, 2007, Aug. 3, 2007, and Aug. 21, 2007, respectively, the relevant portions of which are incorporated herein by reference). A gate structure 400 is then formed on the gate dielectric layer 300. The portions of the gate dielectric layer 300 left exposed (i.e., not masked) by the gate 400 may then be removed.

As illustrated in FIG. 1C, a doped dielectric layer 500 may be patterned or blanket deposited on the substrate, including the lightly doped semiconductor layer 200 and gate structure 400. The substrate and the structures thereon are subsequently heated and/or annealed to diffuse the dopant into the gate structure 400 (when the gate structure 400 comprises a Group IVA element) and desired and/or predetermined regions of the semiconductor layer 200, thereby forming source and drain terminals or regions 210 and 220 adjacent to a channel region 230. The channel region 230 contains a dose or concentration of dopant determined by the amount of dopant in the ink used to form lightly doped semiconductor layer 200. The material(s) in the gate structure 400, the source and drain 210/220, and the channel region 230 may be crystallized and/or the dopant therein activated by further annealing (e.g., thermal or laser annealing), generally at a higher temperature than for diffusion of the dopant.

Although structures and devices (e.g., TFTs) may be printed as previously described herein, the invention is not limited as such. On the contrary, the method to control Vt's (and/or provide a plurality of different Vt's for transistors of a given conductivity type) can be applied to any Si or Ge film, independently of the deposition and/or patterning method. Thus, the method applies to structures and devices made according to conventional methods as well. For example, in some embodiments, when the present ink formulation is blanket-deposited (e.g., by spin-coating), the semiconductor may be deposited as a blanket film and patterned using lithography methods known in the art (e.g., photolithography) and/or etching (e.g., wet etching, laser patterning, etc.).

In alternate embodiments, a conductor (e.g., metal layer) may be formed by conventional metal deposition (e.g., conventional sputtering or evaporation) and photolithography, by conventionally dispensing or printing commercial metal pastes, by conventional electro- or electroless plating, or alternatively, by laser patterning techniques to yield metal contacts and/or interconnects to the source, drain and gate.

Exemplary Methods of Controlling a Threshold Voltage

A further aspect of the present invention concerns a method of controlling a threshold voltage (Vt) of a thin film transistor. In general, the threshold voltage of a thin film transistor may be controlled by (1) making a semiconductor ink comprising a Group IVA compound containing at least five Si and/or Ge atoms, a dopant in an amount effective to provide a film with a dopant atom concentration of from 0.1 to 50 ppm, relative to the number of Group IVA atoms in the film, and a solvent, (2) forming a film from the ink, and (3) activating the dopant in the film. The doped semiconductor ink may have a formulation according to any of the embodiments described herein (see "Exemplary Ink Formulations" above). Furthermore, the semiconductor film may be formed from the semiconductor ink using any of the methods described herein (see "Exemplary Methods of Forming Doped Films" above). By using an ink formulation (e.g., including a polysilane or other Group IVA compound) that has a desired amount of P-type or N-type dopant, the Vt may be controlled and/or shifted to a predetermined and/or desired value after the dopant is activated. Preferably, the ink formulation contains the dopant in amount sufficient to control the threshold voltage of the thin film transistor.

Exemplary dopants for use in the ink formulations of the present method may include boranes, organoboranes, phosphines, arsines, stibines, and/or other phosphorus, arsenic, and antimony compounds. Organoboranes, phosphines, arsines, and/or stibines with relatively high boiling points (e.g., >150° C.) and relatively short substituent chains (e.g., no more than 3-4 carbon units) produce the best results because they have high solubility in silane inks, they are efficiently incorporated into films formed therefrom, and they generally result in the introduction of no or a relatively small amount of incremental carbon impurities in the films. However, other boron, phosphorus, arsenic, and/or antimony compounds may achieve similar results. The addition of a boron compound to the ink shifts the Vt toward a higher value, while addition of a phosphorus compound shifts the Vt toward a lower value. In general, the amount of dopant effective to shift the Vt is from about $1\times10^{16}$ atoms/cc to about $1\times10^{18}$ atoms/cc, or any range of values therein. In one implementation, the amount is approximately $1\times10^{17}$ atoms/cc. This concentration of dopant effectively shifts the Vt without interfering with subsequent processing steps, such as defining the source and the drain by heavily doping part of a silicon island using, e.g., spin-on dopants (see U.S. patent application Ser. Nos. 11/888,942 and 11/888,949, filed on Aug. 3, 2007 and Aug. 3, 2007, respectively, the relevant portions of which are incorporated herein by reference). The dopant may be activated (and the Group IVA element crystallized) by thermal or laser annealing. In embodiments comprising activation by thermal annealing, the annealing step is generally performed at temperatures of from 250° C. to 1000° C. (e.g., 750° C. to 900° C., or any other range of temperatures therein).

EXAMPLES

Controlling Vt Using a Silicon Film Formed from a Silane-Based Ink Containing a Boron Compound In a first trial, inks were formulated by adding one of three different types of boron compounds (an organoborane [tributylborane], a hydroborane [decaborane], and a borane complex [borane trimethylamine complex]) to a cyclopentasilane ink that was optimized for spincoating (e.g., 15 vol. % cyclopentasilane in cyclooctane), as shown in Table 1 below. The amount of each boron compound added was calculated to provide a final/target level of 50 ppm of boron in the film. Films were made for each formulation according to methods described herein, and the films were tested to determine the amount of boron in the resulting films. Results are shown in Table 1 below:

TABLE 1

| Sample | Boron Compound | Doping target [ppm] | Thickness [nm] | Boron actual [ppm], SIMS | Comments |
|---|---|---|---|---|---|
| A | None | None | 103 | 0.8 | Control wafer; 100% coverage |
| B | Tri-butylborane | 50 | 117 | 43.7 | Coverage on wafer not good (40%) |
| C | Decaborane | 50 | 97 | 9.2 | Coverage on wafer not good (60%) |
| D | Borane•NMe$_3$ Complex | 50 | 94 | 1.6 | Coverage on wafer not good (30%) |

The secondary ion mass spectrometry (SIMS) data indicate that the tributylborane doped ink produced the highest boron level in the film. This result may reflect the higher solubility of organoboranes in silane inks relative to the other boranes tested. Tributylborane reflects a balance of high boiling point and relatively low carbon content. For example, the boiling point of triethylborane is 95° C., compared with >200° C. for tributylborane. High boiling points may be advantageous for ensuring that the dopant compound is incorporated in the film during the annealing process, and so that it does not evaporate. Low carbon content (i.e., relatively small or short chains in the substituents of the organoborane) may be advantageous because of the smaller amount of carbon impurities introduced in the silicon film. Side chains that are too small or short may result in reduced solubility of the organoborane in the silicon ink. However, substituents of the formula -A$_n$H$_{2n+1}$ may also be advantageous, as may dopant compounds of the formulas (AH$_z$)$_n$(DR$^1$)$_m$, D$_a$R$^1$$_b$, (R$^2$$_3$A)$_r$A$_c$(DR$^1$$_2$)$_s$, or (A$_n$H$_z$)$_m$(DR$^1$$_{3-m'}$)$_q$, where n is at least 3 (e.g., from 3 to 100, 3 to 50, 3 to 12, or any range of values greater than 3), m is 1 or 2, each of the n instances of A is independently Si or Ge, each of the n instances of z is independently 1 or 2, each of the m instances of D is Sb, As, P or B, and each of the m instances of R$^1$ is alkyl, aryl, aralkyl, or AR$^2$$_3$, where R$^2$ is hydrogen, alkyl, aryl, aralkyl, or A$_y$H$_{2y+1}$ (where y is an integer of 1 to 4), a is from 1 to 20, b is an integer corresponding to the number of binding sites available on the a instances of D, and each of the b instances of R$^1$ is independently H, alkyl, aryl, aralkyl or AR$^2$$_3$, and at least one of the b instances of R$^1$ is alkyl, aryl, aralkyl or AR$^2$$_3$, c is 1 to 4, r+s=2c+2, s≥1, z is from (n−q) to (2n+2−q), m' is an integer from 1 to 3, q is 1 or 2 (see, e.g., U.S. Pat. No. 7,314,513, the relevant portions of which are incorporated herein by reference).

In a second trial, tri-butylborane was used as an ink additive in the silane-containing ink of Trial 1 above (e.g., 15 vol. % cyclopentasilane in cyclooctane), targeting a lower boron content in the resulting film. In the second trial, tributylborane was used as an ink additive over a range of boron dose levels and/or concentrations in the films, in which the transistor threshold voltage shifts to more positive values with increasing concentration of the boron additive in the silicon films. SIMS data indicate that variation between target boron concentration and the measured concentration in the film was fairly consistent across the range of boron concentrations examined. Results are shown in Table 2 below:

TABLE 2

| Sample | Boron Type | B-doped target [ppm] | Thickness [nm] | B actual in SIMS [ppm] | Comments |
|---|---|---|---|---|---|
| A | Tri-butylborane | 2.5 | 114 | 2.93 | 100% coverage |
| B | Tri-butylborane | 5 | 101 | 6.38 | 100% coverage |
| C | Tri-butylborane | 10 | 99 | 12.84 | 100% coverage |

Figure 2:
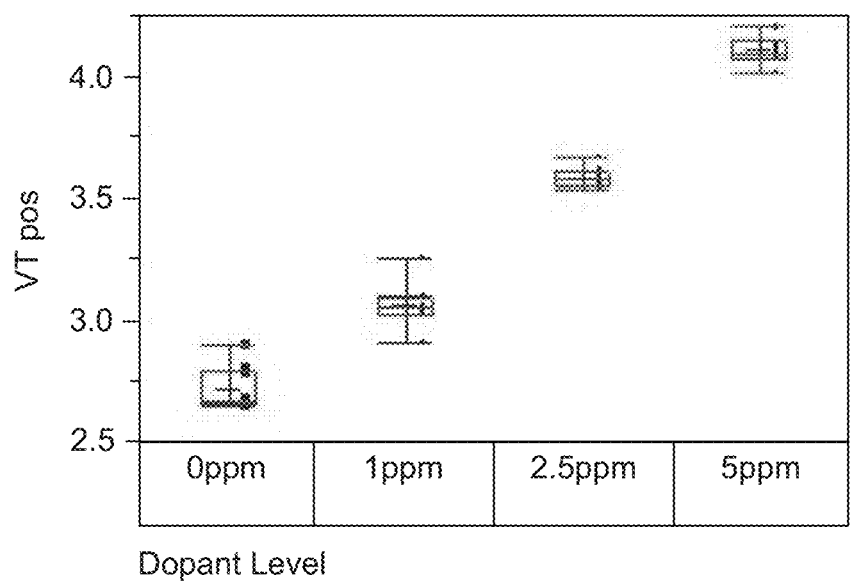
FIG. 2 is a graph showing threshold voltage dependence versus boron content in a NMOS thin film transistor made using doped silicon inks formulated in accordance with embodiments of the present invention.

In a third trial, films with 1, 2.5, and 5 ppm targeted boron content were spin-coated on a substrate. Thin film transistors (TFTs) were produced from these films. As shown in FIG. 2 and Table 3 below, the threshold voltage increased with increasing boron content. The Vt increase observed between wafers with nominally the same boron content seems related to local autodoping during silicon film cure.

TABLE 3

Vt dependence v. boron content in NMOS TFTs made using silicon inks containing tributylborane

| Wafer Type | Control | 1 ppm | 2.5 ppm | 5 ppm |
|---|---|---|---|---|
| D-1 | 2.5 V | | | |
| D-2 | 2.7 V | | | |
| E-1 | | 3.0 | | |
| E-2 | | 3.4 | | |
| F-1 | | | 3.6 V | |
| F-2 | | | 4.0 V | |
| G-1 | | | | 4.5 V |
| G-2 | | | | 4.1 V |

CONCLUSION/SUMMARY

Thus, the present invention provides doped ink formulations, methods of making doped semiconductor ink formulations, methods of forming doped semiconductor thin films from such ink formulations, and methods for modifying and controlling the threshold voltage of a TFT using the same. The formulations and methods described herein provide for independent and variable control over centering the threshold voltage (Vt) of N-type and P-type TFTs. The present invention may be used to independently tailor the threshold voltages of different TFTs (e.g., of different type and/or function), or if desired of individual TFTs, by printing or otherwise depositing silicon inks containing different amounts of dopant. The advantages of using the formulations and methods described herein over the conventional method of masking and implanting include a reduction in the number of steps required, as well as a reduction in cycle time and production costs.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An ink formulation comprising:
   a) a silane, germane, and/or silagermane compound containing at least five Si and/or Ge atoms;
   b) a dopant and/or dopant precursor in an initial concentration of from 0.001 M to 0.1 M and in an amount effective to (i) provide a film made from the silane, germane, and/or silagermane compound with a dopant atom concentration of from 1 to 10 ppm relative to the number of Si and Ge atoms and (ii) control a threshold voltage of a thin film transistor including the film, wherein the dopant and/or dopant precursor has the formula $PR_3$, $BR_3$ or $B_2R_6$, where each R is independently selected from the group consisting of $C_1$-$C_{10}$ alkyl, $C_6$-$C_{10}$ aryl, $C_6$-$C_{10}$ aryl substituted with 1 to 3 $C_1$-$C_4$ alkyl groups, $C_7$-$C_{12}$ aralkyl, hydrogen, $SiR'_3$ and $Si_xH_{2x+1}$, where R' is independently hydrogen, $C_6$-$C_{10}$ aryl, $C_6$-$C_{10}$ aryl substituted with 1 to 3 $C_1$-$C_4$ alkyl groups, or $Si_xH_{2x+1}$, and x is an integer of from 1 to 4, such that the combined R and R' groups include at least from 6 to 18 carbon atoms per phosphorous or boron atom and the dopant and/or dopant precursor has a boiling point of >150° C.; and
   c) a solvent selected from the group consisting of linear alkanes, cycloalkanes, arenes, fluoroalkanes and siloxanes, wherein the dopant and/or dopant precursor is soluble in the ink formulation.

2. The formulation of claim 1, wherein the Group IVA compound comprises a polysilane having at least 15 Si and/or Ge atoms.

3. The formulation of claim 1, wherein the dopant has the formula $PR_3$, $BR_3$ or $B_2R_6$, where each R is independently selected from the group consisting of $C_1$-$C_6$ alkyl, $C_6$-$C_{10}$ aryl, $C_6$-$C_{10}$ aryl substituted with 1 to 3 $C_1$-$C_4$ alkyl groups, $SiR'_3$ and $Si_xH_{2x+1}$, where R' is independently hydrogen, $C_6$-$C_{10}$ aryl, $C_6$-$C_{10}$ aryl substituted with 1 to 3 $C_1$-$C_4$ alkyl groups, or $Si_xH_{2x+1}$, and x is an integer of from 1 to 4.

4. The formulation of claim 1, wherein the dopant is present in an amount sufficient to provide a film with a dopant atom concentration of from 1 to 5 ppm, relative to the number of Si and Ge atoms.

5. The formulation of claim 1, wherein the silane, germane, and/or silagermane compound is present in an amount of from about 0.1 to 50 wt. % of the formulation.

6. The formulation of claim 1, wherein the solvent is selected from the group consisting of $C_5$-$C_{12}$ cycloalkanes and $C_6$-$C_{10}$ arenes.

7. The formulation of claim 1, wherein said silane, germane, and/or silagermane compound consists essentially of (1) silicon and/or germanium and (2) hydrogen.

8. The formulation of claim 7, wherein said silane, germane, and/or silagermane compound consists essentially of (1) silicon and (2) hydrogen.

9. The formulation of claim 1, wherein said silane, germane, and/or silagermane compound is present in an amount of from about 1 to 20 wt. % of the formulation.

10. The formulation of claim 1, wherein the dopant has the formula $PR_3$ or $BR_3$, where each R is independently selected from the group consisting of $C_1$-$C_{10}$ alkyl and $C_6$-$C_{10}$ aryl, such that the combined R groups include from 6 to 18 carbon atoms per phosphorous or boron atom.

11. A method of making a doped silane ink, comprising:
   a) combining a silane, germane, and/or silagermane compound containing at least five Si and/or Ge atoms, a dopant in an initial concentration of from 0.001 M to 0.1 M and in an amount effective to provide a film made from the silane, germane, and/or silagermane compound with a dopant atom concentration of from 1 to 10 ppm relative to the number of Si and Ge atoms, and a solvent, wherein the solvent is selected from the group consisting of linear alkanes, cycloalkanes, arenes, fluoroalkanes and siloxanes, and the dopant and/or dopant precursor (i) is soluble in the combined silane, germane, and/or silagermane compound and the solvent and (ii) has the formula $PR_3$, $BR_3$ or $B_2R_6$, where each R is independently selected from the group consisting of $C_1$-$C_{10}$ alkyl, $C_6$-$C_{10}$ aryl, $C_6$-$C_{10}$ aryl substituted with 1 to 3 $C_1$-$C_4$ alkyl groups, $C_7$-$C_{12}$ aralkyl, hydrogen, $SiR'_3$ and $Si_xH_{2x+1}$, where R' is independently hydrogen, $C_6$-$C_{10}$ aryl, $C_6$-$C_{10}$ aryl substituted with 1 to 3 $C_1$-$C_4$ alkyl groups, or $Si_xH_{2x+1}$, and x is an integer of from 1 to 4, such that the combined R and R' groups include from 6 to 18 carbon atoms per phosphorous or boron atom and the dopant and/or dopant precursor has a boiling point of >150° C.; and
   b) mixing the silane, dopant, and solvent to form a solution.

12. The method of claim 11, wherein the silane, germane, and/or silagermane compound comprises a polysilane having at least 15 Si and/or Ge atoms.

13. The method of claim 11, wherein the silane, germane, and/or silagermane compound is present in an amount of from about 0.1 to about 50 wt. % of the formulation.

14. The method of claim 11, where each R is independently selected from the group consisting of $C_1$-$C_{10}$ alkyl, $C_6$-$C_{10}$ aryl, $C_6$-$C_{10}$ aryl substituted with 1 to 3 $C_1$-$C_4$ alkyl groups, $C_7$-$C_{12}$ aralkyl, and $Si_xH_{2x+1}$, where x is an integer of from 1 to 4.

15. The method of claim 11, wherein the dopant is present in an amount sufficient to provide a film with a dopant atom concentration of from 1 to 5 ppm, relative to the number of Si and Ge atoms.

16. The method of claim 11, wherein the solvent is selected from the group consisting of $C_5$-$C_{12}$ cycloalkanes and $C_6$-$C_{10}$ arenes.

17. The method of claim 11, wherein said silane, germane, and/or silagermane compound consists essentially of (1) silicon and/or germanium and (2) hydrogen.

18. The method of claim 17, wherein said silane, germane, and/or silagermane compound consists essentially of (1) silicon and (2) hydrogen.

19. The method of claim 11, wherein said silane, germane, and/or silagermane compound is present in an amount of from about 1 to 20 wt. % of the formulation.

20. The method of claim 11, wherein the dopant has the formula $PR_3$ or $BR_3$, where each R is independently selected from the group consisting of $C_1$-$C_{10}$ alkyl and $C_6$-$C_{10}$ aryl, such that the combined R groups include from 6 to 18 carbon atoms per phosphorous or boron atom.

* * * * *